United States Patent [19]
Lee

[11] Patent Number: 5,519,749
[45] Date of Patent: May 21, 1996

[54] HORIZONTAL CHARGE COUPLED DEVICE HAVING A MULTIPLE RESET GATE

[75] Inventor: Seo K. Lee, Kyungki-do, Rep. of Korea

[73] Assignee: Goldstar Electron Co., Ltd., Cheongju, Rep. of Korea

[21] Appl. No.: 376,513

[22] Filed: Jan. 23, 1995

Related U.S. Application Data

[62] Division of Ser. No. 867,243, Apr. 10, 1992.

[30] Foreign Application Priority Data

Apr. 13, 1991 [KR] Rep. of Korea .................... 5112/1991

[51] Int. Cl.$^6$ .......................... H01L 29/796; G11C 27/04
[52] U.S. Cl. ................................ 377/58; 377/60; 377/62; 257/241
[58] Field of Search ..................... 377/58, 60, 62; 257/239, 240, 241

[56] References Cited

U.S. PATENT DOCUMENTS

| | | | |
|---|---|---|---|
| 3,896,485 | 7/1975 | Early | 257/223 |
| 3,931,674 | 1/1976 | Amelio | 437/50 |
| 4,135,104 | 1/1979 | Allen | 377/58 |
| 4,649,554 | 3/1987 | Boudewijns et al. | 377/60 |
| 4,993,053 | 2/1991 | Itoh et al. | 377/60 |

OTHER PUBLICATIONS

Charge–Coupled Devices—An Overview by Walter F. Kosonocky, RCA Laboratories, Princeton, New Jersey . . . Reprinted with permission from 1974 Western Electron, Show and Conv. Tech. Papers, vol. 18, Sep. 10–13, 1974, pp. 2/1–2/20.

Noise Sources in Charge–Coupled Devices, by J. E. Carnes and W. F. Kosonocky, RCA Laboratories, Princeton, New Jersey . . . Reprinted with permission from RCA Rev., vol. 33, pp. 327–343, Jun. 1972.

The ABCs of CCDs, by Walter F. Kosonocky and Donald J. Sauer—Technical Staff—RCA Laboratories, Princeton, New Jersey . . . Reprinted with permission from Electron. Des., vol. 23, pp. 58–63, Apr. 12, 1975.

*Primary Examiner*—John S. Heyman
*Attorney, Agent, or Firm*—Alan R. Loudermilk

[57] ABSTRACT

A horizontal charge coupled device (HCCD) is provided with a multiple reset gate in order to establish a more stable, less noisy voltage in an output node floating diffusion. Charges are transferred from an input of the HCCD to the floating diffusion by multiple, overlapping gate structures. Signal charges are detected or read out from the floating diffusion through an amplifier/inverter circuit. Periodically, the voltage of the floating diffusion is established to a reference level by application of a reset signal to a multiple reset gate structure, which results in charges in the floating diffusion being transferred to a reset drain. Noise induced by the reset operation is lessened on average due to the multiple reset gate structure.

27 Claims, 2 Drawing Sheets

HORIZONTAL CHARGE COUPLED DEVICE HAVING A MULTIPLE RESET GATE

This is a divisional of copending application Ser. No. 07/867,243 filed on Apr. 10, 1992.

BACKGROUND OF THE INVENTION

1. Field of the Invention.

The present invention relates to horizontal charge coupled devices (HCCDs), and particularly to an HCCD having a multiple reset gate for establishing a more stable, less noisy reference level for reading an output signal of the HCCD.

2. Description of the Prior Art

FIG. 1a illustrates a plan view of a structure of an HCCD according to the prior art. FIG. 1b illustrates the signal waveform diagram corresponding to portions of the HCCD illustrated in FIG. 1a. FIG. 1c illustrates the potential profile taken along line 1c—1c of FIG. 1a.

In an HCCD according to the prior art, as shown in FIG. 1a, a buried or bulk charge coupled device (BCCD) 3 is formed, wherein first poly gates 5 and second poly gates 2 are successively formed over barrier region 4 in an overlapping manner. As more fully discussed below, with appropriate voltages successively applied to first poly gates 5 and second poly gates 2, electrical charges may be propagated or transferred along the HCCD to reach n+-type floating diffusion region 1. Floating diffusion 1, which is the region to which output terminal Vout is connected through amplifier/inverter circuit 7, is formed adjacent to rightmost second poly gate 2 and receives charge transferred from barrier region 4 of BCCD 3 through application of an appropriate signal to terminal VoG. Second poly gate 2a connected to terminal RG (sometimes referred to herein as reset gate 2a) is used to periodically establish floating diffusion 1 to a reference potential. Reset gate 2a has a channel which is formed in the shape of a horn in order to decrease the partition noise. Outside of the active regions of the HCCD, channel stopper region 6 is formed.

The operation of the aforesaid structure of an HCCD as illustrated in FIG. 1a will be described in more detail with reference to FIG. 1b and FIG. 1c.

Through application of appropriate signals (respectively H and L states) to terminals HΦ1 and HΦ2 of FIG. 1a as shown in FIG. 1b, signal charges may be propagated or transferred through the HCCD, and with an appropriately timed signal to terminal VoG, the signal charges may be transferred to floating diffusion 1. The signal charges transferred to floating diffusion 1 may be detected or read out through terminal Vout through amplifier/inverter circuit 7, which as is known in the art can be any suitable amplifier or inverter circuit. Periodically, the potential of floating diffusion 1 is reset to an initial reference level. Through application of appropriate H state and L state signals to terminals HΦ1, HΦ2 and VoG of FIG. 1a, the signal charges may be transferred to n+-type floating diffusion region 1, and may be subsequently discharged to reset drain 1a through application of a H state signal ΦRG to terminal RG of reset gate 2a (reset gate 2a thus being turned on). An appropriate bias voltage level is applied to reset drain 1a through terminal RD.

As a result of the above, n+-type floating diffusion region 1, to which output terminal Vout is connected through amplifier/inverter circuit 7, is biased to the initial reference state, and the reference voltage of the output signal on terminal Vout is established.

In the structure of an HCCD according to the prior art, a H state reset signal ΦRG is applied to terminal RG of reset gate 2a to discharge the signal charges to reset drain 1a. At this time, because the flow of signal charges stored in n+-type floating diffusion region 1 is redistributed in BCCD 3a (formed by second poly gate 2a) by the application of reset signal ΦRG to terminal RG of reset gate 2a, ripple noise and partition noise are generated between a capacitor (such as the capacitance of floating diffusion 1) and a resistor (such as the channel resistance under second poly gate 2a).

As a result thereof, the resulting voltage level established in floating diffusion 1 is unstable and deviates from the desired reference voltage level Vref as shown in FIG. 1c. This undesired deviation of the voltage of floating diffusion 1 from the desired reference level Vref results in "noise" in the signal charges detected or read out through terminal Vout.

SUMMARY OF THE INVENTION

It is an object of the present invention to provide a structure of an HCCD having a reset gate which is formed of a multiple-type gate structure, and in the preferred embodiment dual-type gate structure, which results in a more stable, less noisy reference level being established in an output node floating diffusion, resulting in a more stable, less noisy reading of the output signal of the HCCD.

In order to achieve the above object of the present invention, there is provided a structure of an HCCD in which one poly gate is formed over a floating diffusion region to form a BCCD at the overlapped portion thereof. A reset gate is formed by the poly gate to flow the signal charges stored in the floating diffusion region into a reset drain upon application of an appropriate signal to the reset gate, whereby an initial reference state or level is established in the floating diffusion.

In the present invention, the floating diffusion region is formed in a divided manner into plural portions in the direction of the reset drain. The poly gate of the reset gate is formed over the floating diffusion region so as to form a multiple reset gate, plural CCD structure. With the multiple reset gate structure of the present invention, a more stable, less noisy initial reference level is established in the floating diffusion.

BRIEF DESCRIPTION OF THE DRAWINGS

The features and advantages of the present invention will be more clearly appreciated from the following description of the preferred embodiments of the present invention taken in conjunction with the accompanying drawings in which:

FIG. 1b is a driving clock signal waveform diagram of portions of FIG. 1a.

FIG. 1c is a potential distribution diagram of a cross-sectional view taken along line A—A' of FIG. 1a.

FIG. 2b is a driving clock signal waveform diagram of portions of FIG. 2a.

DETAILED DESCRIPTION OF THE INVENTION

The structure and operation of a multiple reset gate of an HCCD according to the present invention will be described in more detail with reference to FIG. 2a and FIG. 2b.

Figure 1A:
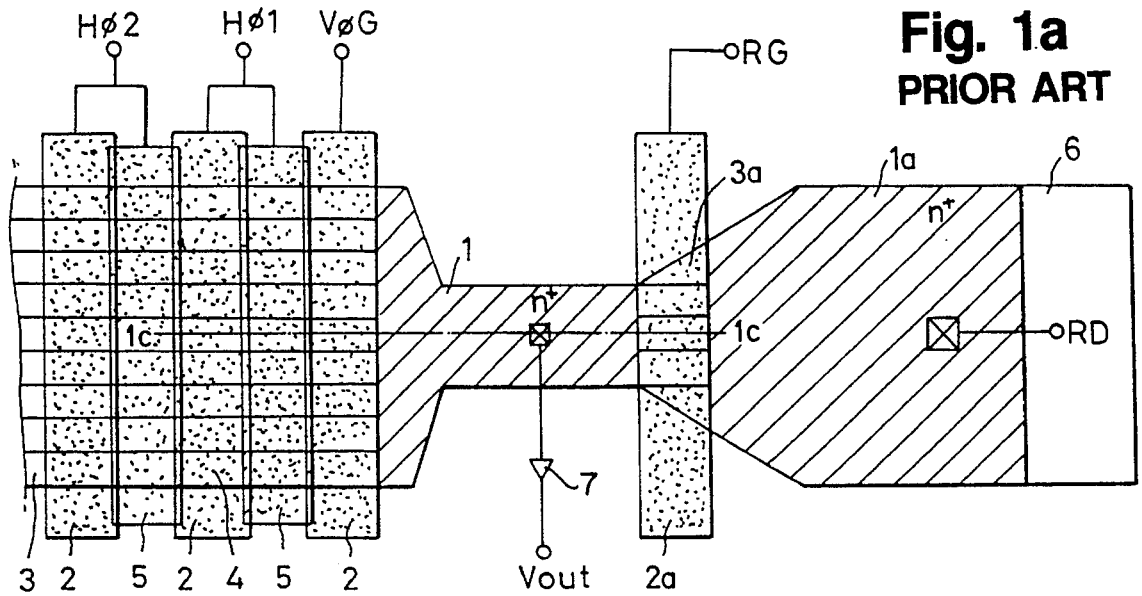
FIG. 1a is a plan view illustrating a structure of an HCCD according to the prior art.
Figure 1B:
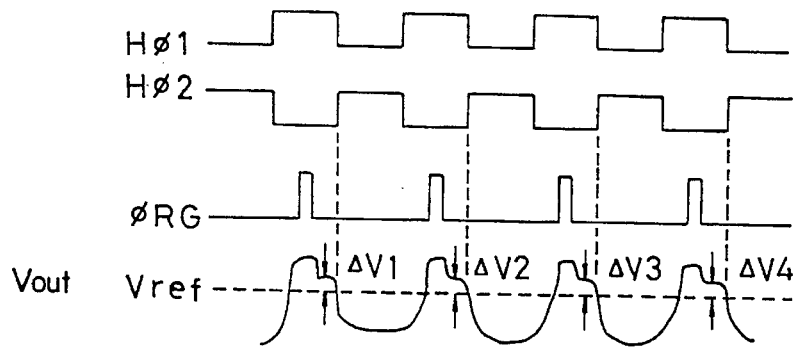
Figure 1C:
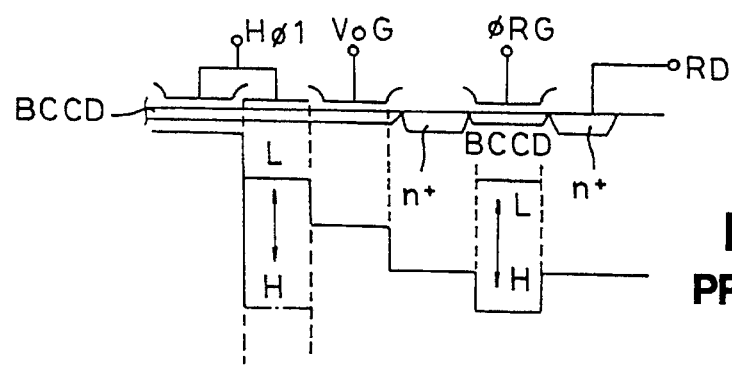
Figure 2A:
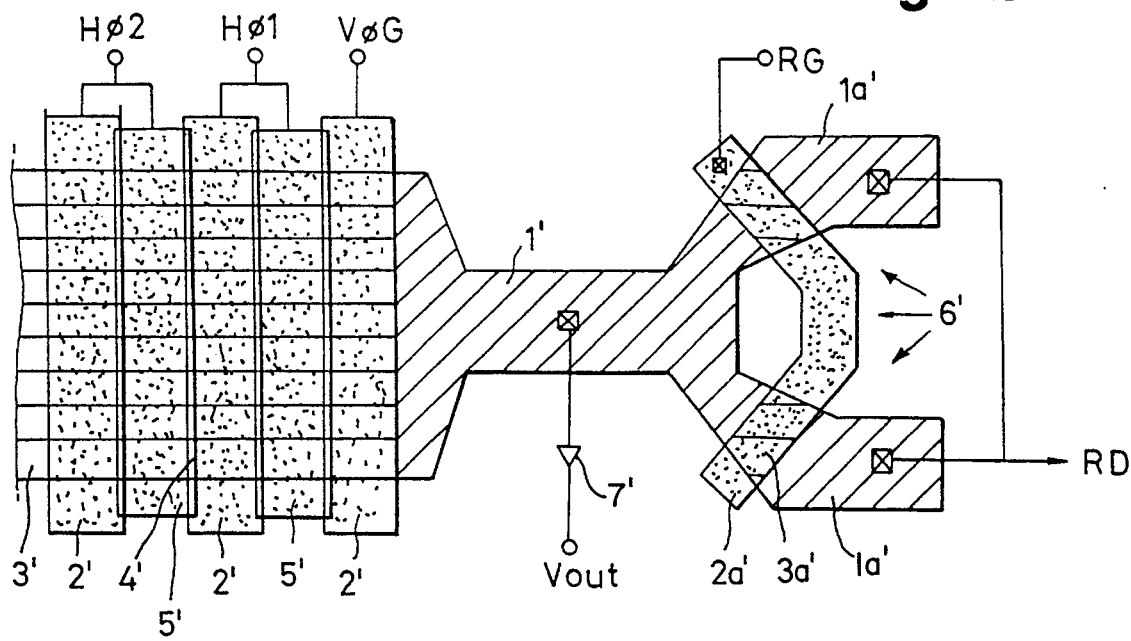
FIG. 2a is a plan view illustrating a structure of an HCCD according to the present invention.
Figure 2B:
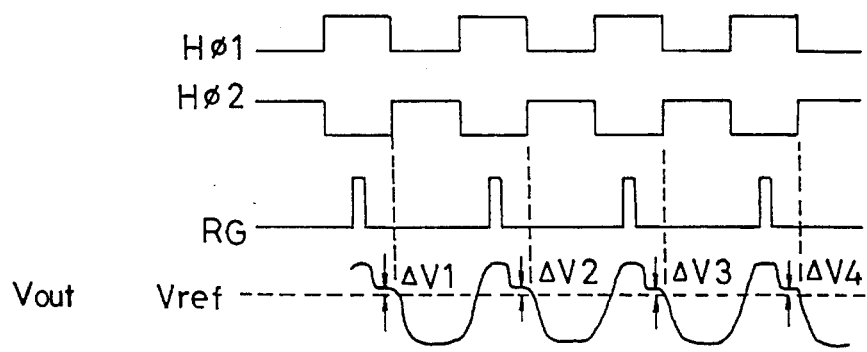

FIG. 2a illustrates a structure of an HCCD according to the present invention, and FIG. 2b illustrates a waveform diagram of portions of the HCCD illustrated in FIG. 2a. The transfer of signal charges through BCCD 3' (by way of appropriate signals being applied to first poly gates 5' and second poly gates 2' over barrier region 4') to n+-type floating diffusion region 1', and the detection or read out of the signal charges through terminal Vout through amplifier/ inverter circuit 7, are substantially as discussed above with respect to the prior art structure illustrated in FIG. 1a and will not be discussed in detail here. Also, as with the prior art structure discussed above, channel stopper region 6' is formed outside of the active regions of the HCCD in a conventional manner. The multiple reset gate structure of the present invention, used for periodically establishing floating diffusion 1' to a reference potential, will now be described.

As shown in FIG. 2a, n+-type floating diffusion region 1' is formed in a divided manner in the direction of plural reset drains 1a'. In the preferred embodiment, floating diffusion 1' is divided into two portions in the direction of reset drains 1a'. Reset drains 1a' are established to the same bias level through terminal RD, with the bias applied to terminal RD being selected to establish the desired initial reference level in floating diffusion 1'. As illustrated in FIG. 2a, second poly gate 2a' (or reset gate 2a') is formed over portions of n+-type floating diffusion region 1' to form plural BCCDs 3a' defined by the plural channels of reset gate 2a'. Terminal RG is connected to reset gate 2a', and is driven by clock signal ΦRG which is applied thereto.

In the preferred embodiment, BCCDs 3a' are designed and manufactured to have the same geometry as far as possible.

The operation of an HCCD with a reset gate structure in accordance with the present invention will be described in more detail with reference to FIG. 2b.

When signals HΦ1 and HΦ2 in FIG. 2a are respectively H state and L state, if clock signal ΦRG applied to dual reset gate 2a' (in which two BCCDs 3a' are formed) is H state, the signal charges stored in n+-type floating diffusion region 1' are separately flowed into reset drains 1a', which are established to the same bias level through terminal RD. The flow of the charge is redistributed in each of BCCDs 3a' by clock signal ΦRG applied to terminal RG of reset gate 2a' as shown in FIG. 2a and FIG. 2b.

In an HCCD of the present invention, ripple noise and partition noise also are generated between a resistor (such as the channel resistance under the multiple channels of reset gate 2a') and a capacitor (such as the capacitance of floating diffusion 1'), and such noise sources randomly affect the reference voltage established in floating diffusion 1', which in turn randomly affects the signal which is output through output terminal Vout. However, because two (or more) BCCDs 3a' are used for reset gate 2a' in the present invention, the average size of two random factors becomes smaller on average than the size of the prior single random factor. Therefore, as shown in FIG. 2b, the variation of the established reference voltage in floating diffusion 1' from the desired initial reference level Vref becomes less than that of prior art HCCD structures.

While in one embodiment of the present invention two BCCDs 3a' formed by the channel of reset gate 2a' as illustrated in FIG. 2a, in other embodiments reset gate 2a' is formed to be divided into several parts (multiple-type reset gate structure) so as to decrease the random noise factor even more.

As discussed above, in the present invention the channel of reset gate 2a' is formed into a dual-type or multiple-type structure so that a more stable, less noisy reference voltage can be established for less noisy reading out of the signal charges stored in the HCCD.

It will be understood by those skilled in the art that the foregoing description is in terms of a preferred embodiment of the present invention wherein various changes and modifications may be made without departing from the spirit and scope of the invention, as set forth in the appended claims.

What is claimed is:

1. A method for resetting an output region of a charge coupled device to a reference voltage level, comprising the steps of:

(a) establishing a predetermined voltage level in one or more reset drain regions; and (b) applying a reset signal to a plural reset gate structure, wherein in response to the reset signal electrical charges are transferred from the output region to one or more of the reset drain regions through a plurality of reset channels defined by the plural reset gate structure.

2. The method as claimed in claim 1 wherein the output region is established to a reference voltage level in response to electrical charges being transferred to one or more of the reset drain regions.

3. The method of claim 1 wherein the number of reset channels is two.

4. The method of claim 1 wherein each of the reset channels is substantially of the same size.

5. The method of claim 1 wherein each of the reset channels is substantially of the same shape.

6. The method of claim 1 wherein each reset channel has a greater width dimension at the extremity of the reset channel nearest the one or more reset drain regions than at the extremity of the reset channel nearest the output region.

7. The method of claim 1 wherein the output region comprises a floating diffusion.

8. The method of claim 1 wherein the output region comprises an n+ region.

9. The method of claim 1 wherein the output region includes a plurality of projecting portions in the direction of the one or more reset drain regions, wherein the plural reset gate structure comprises a single reset gate overlapping the plurality of projecting portions of the output region, wherein the overlapping of the single reset gate with the plurality of projections of the output region defines the plurality of reset channels.

10. The method of claim 9, wherein the number of reset channels is two, wherein the single reset gate is substantially in the shape of a V.

11. A method for generating an output signal from a charge coupled device having a signal input, comprising the steps of:

(a) generating electrical charges at the signal input in response to a signal being applied to the signal input;

(b) transferring the electrical charges from the signal input to an output region;

(c) generating an output signal, wherein the output signal is derived from the electrical charges transferred to the output region; and (d) transferring the electrical charges from the output region to one or more reset drain regions through a plurality of reset channels, wherein each reset channel has a greater width dimension at the extremity of the reset channel nearest the one or more reset drain regions than at the extremity of the reset channel nearest the output region.

12. The method as claimed in claim 11 wherein the output region is established to a reference voltage level in response to electrical charges being transferred to the one or more reset drain regions.

13. The method of claim 11 wherein the number of reset channels is two.

14. The method of claim 11 wherein each of the reset channels is substantially of the same size.

15. The method of claim 11 wherein each of the reset channels is substantially of the same shape.

16. The method of claim 11 wherein the output region comprises a floating diffusion.

17. The method of claim 11 wherein the output region comprises an n+ region.

18. The method of claim 11 wherein the output region includes a plurality of projecting portions in the direction of the one or more reset drain regions, wherein a single reset gate overlaps the plurality of projecting portions of the output region, wherein the overlapping of the single reset gate with the plurality of projections of the output region defines the plurality of reset channels.

19. The method of claim 18, wherein the number of reset channels is two, wherein the single reset gate is substantially in the shape of a V.

20. A method for resetting an output region of a charge coupled device to a reference voltage level, comprising the steps of:

(a) establishing a predetermined voltage level in one or more reset drain regions; and (b) transferring electrical charges from the output region to one or more of the reset drain regions in response to one or more reset signals through a plurality of reset channels, wherein each reset channel has a greater width dimension at the extremity of the reset channel nearest the one or more reset drain regions than at the extremity of the reset channel nearest the output region.

21. The method of claim 20 wherein the number of reset channels is two.

22. The method of claim 20 wherein each of the reset channels is substantially of the same size.

23. The method of claim 20 wherein each of the reset channels is substantially of the same shape.

24. The method of claim 20 wherein the output region includes a plurality of projecting portions in the direction of the one or more reset drain regions, wherein a single reset gate overlaps the plurality of projecting portions of the output region, wherein the overlapping of the single reset gate with the plurality of projections of the output region defines the plurality of reset channels.

25. The method of claim 24, wherein the number of reset channels is two, wherein the single reset gate is substantially in the shape of a V.

26. A method for resetting an output region of a charge coupled device to a reference voltage level, comprising the steps of:

(a) establishing a predetermined voltage level in one or more reset drain regions; and (b) transferring electrical charges from the output region to one or more of the reset drain regions in response to one or more reset signals through at least two reset channels, wherein the output region includes at least two projecting portions in the direction of the one or more reset drain regions, wherein a single reset gate substantially in the shape of a V overlaps the at least two projecting portions of the output region, wherein the overlapping of the single reset gate with the plurality of projections of the output region defines the at least two reset channels.

27. The method of claim 26 wherein each reset channel has a greater width dimension at the extremity of the reset channel nearest the one or more reset drain regions than at the extremity of the reset channel nearest the output region.

* * * * *